United States Patent
Ghannouchi et al.

(10) Patent No.: US 8,724,733 B2
(45) Date of Patent: May 13, 2014

(54) ALL-DIGITAL MULTI-STANDARD TRANSMITTERS ARCHITECTURE USING DELTA-SIGMA MODULATORS

(75) Inventors: Fadhel M. Ghannouchi, Calgary (CA); Mohamed Helaoui, Calgary (CA); Safar Hatami, Calgary (CA); Renato Negra, Aachen (DE)

(73) Assignee: Fadhel M. Ghannouchi, Calgary, Alberta (CA)

( * ) Notice: Subject to any disclaimer, the term of this patent is extended or adjusted under 35 U.S.C. 154(b) by 428 days.

(21) Appl. No.: 12/442,214

(22) PCT Filed: Jan. 11, 2008

(86) PCT No.: PCT/CA2008/000060
§ 371 (c)(1),
(2), (4) Date: Dec. 16, 2009

(87) PCT Pub. No.: WO2009/055897
PCT Pub. Date: May 7, 2009

(65) Prior Publication Data
US 2010/0183093 A1 Jul. 22, 2010

Related U.S. Application Data

(60) Provisional application No. 60/996,140, filed on Nov. 2, 2007.

(51) Int. Cl.
*H04L 27/00* (2006.01)
(52) U.S. Cl.
USPC ............ 375/295; 375/296; 375/300; 375/302

(58) Field of Classification Search
USPC .................. 375/295, 302, 300, 296
See application file for complete search history.

(56) References Cited

U.S. PATENT DOCUMENTS

| | | | |
|---|---|---|---|
| 5,534,827 A * | 7/1996 | Yamaji | 332/103 |
| 6,339,621 B1 * | 1/2002 | Cojocaru et al. | 375/247 |
| 6,542,094 B1 * | 4/2003 | Venkitachalam et al. | 341/61 |
| 6,611,570 B1 * | 8/2003 | Subramanian | 375/326 |
| 7,023,267 B2 | 4/2006 | Lee et al. | |

(Continued)

FOREIGN PATENT DOCUMENTS

JP 2004-072735 3/2004

OTHER PUBLICATIONS

Schreier, et al., "A10-300-MHZ IF-digitzing IC with 90-105 db dynamic range and 15-333-kHz bandwidth," IEEE Journal of Solid-State Circuits, vol. 37, No. 12, Dec. 2002, pp. 1636-1644.

(Continued)

*Primary Examiner* — Kenneth Lam
(74) *Attorney, Agent, or Firm* — BCF LLP

(57) ABSTRACT

The present disclosure is concerned with a digital transmitter using Delta-Sigma modulators (DMSs) that uses an up-sampler and modulator block that follows the DSMs to generate the RF equivalent of the baseband signal to be transmitted. The up-sampler and modulator block is simple to implement and contains only one or a few multiplexers implemented in high speed logic technology.

19 Claims, 9 Drawing Sheets

(56) References Cited

U.S. PATENT DOCUMENTS

| | | | |
|---|---|---|---|
| 7,061,989 B2 * | 6/2006 | Bellaouar et al. | 375/295 |
| 7,158,578 B2 * | 1/2007 | Khlat | 375/261 |
| 7,227,910 B2 * | 6/2007 | Lipka | 375/302 |
| 7,236,112 B2 * | 6/2007 | Hickling | 341/143 |
| 7,286,008 B2 | 10/2007 | Watts | |
| 7,551,904 B2 * | 6/2009 | Lee et al. | 455/110 |
| 7,738,597 B2 * | 6/2010 | Smaini et al. | 375/316 |
| 2002/0145546 A1 * | 10/2002 | May | 341/61 |
| 2002/0145547 A1 * | 10/2002 | May | 341/61 |
| 2004/0192229 A1 * | 9/2004 | Morris et al. | 455/91 |
| 2004/0223553 A1 * | 11/2004 | Kumar | 375/259 |
| 2004/0263365 A1 * | 12/2004 | Robinson et al. | 341/77 |
| 2005/0001748 A1 * | 1/2005 | Clement et al. | 341/143 |
| 2005/0075744 A1 * | 4/2005 | Reefman et al. | 700/94 |
| 2006/0094376 A1 * | 5/2006 | Lee et al. | 455/118 |
| 2006/0115005 A1 * | 6/2006 | Hickling | 375/247 |
| 2006/0119493 A1 | 6/2006 | Tal et al. | |
| 2006/0188027 A1 | 8/2006 | Jeckeln et al. | |
| 2006/0291589 A1 * | 12/2006 | Eliezer et al. | 375/302 |
| 2011/0007836 A1 * | 1/2011 | Schlee et al. | 375/295 |

OTHER PUBLICATIONS

Fujimoto et al., "A delta-sigma modulator for a 1-bit digital switching amplifier", IEEE Journal Solid-State Circuits, vol. 40, No. 9, Sep. 2005, pp. 1865-1871.

Jensen et al., "A 3.2-Ghz second-order delta-sigma modulator implemented in InP HBT technology," IEEE Journal Solid-State Circuits, vol. 30, No. 10, Oct. 1995, pp. 1119-1127.

Ketola et al., "Transmitter utilising bandpass delta-sigma modulator and switching mode power amplifier", Proc. Intl. Sym. Circuits and Systems (ISCAS), May 2004, pp. I-663-I-636.

Sandler, "Digital-to-analogue conversion using pulse with modulation". IEE Electronics and Communication Engineering Journal, Dec. 1993, pp. 339-348.

Magrath et al., Design and implementation of a FPGA Sigma-Delta Power DAC, Signal Processing Systems: Design and Implementations, IEEE press, 0-7803-3806-5, 1997, pp. 511-521.

Jerng et al., "A Wideband Digital-RF Modulator for High Data Rate Transmitters, "IEEE Journal of Solid-State Circuits, vol. 42, No. 8, Aug. 2007, pp. 1710-1722.

* cited by examiner

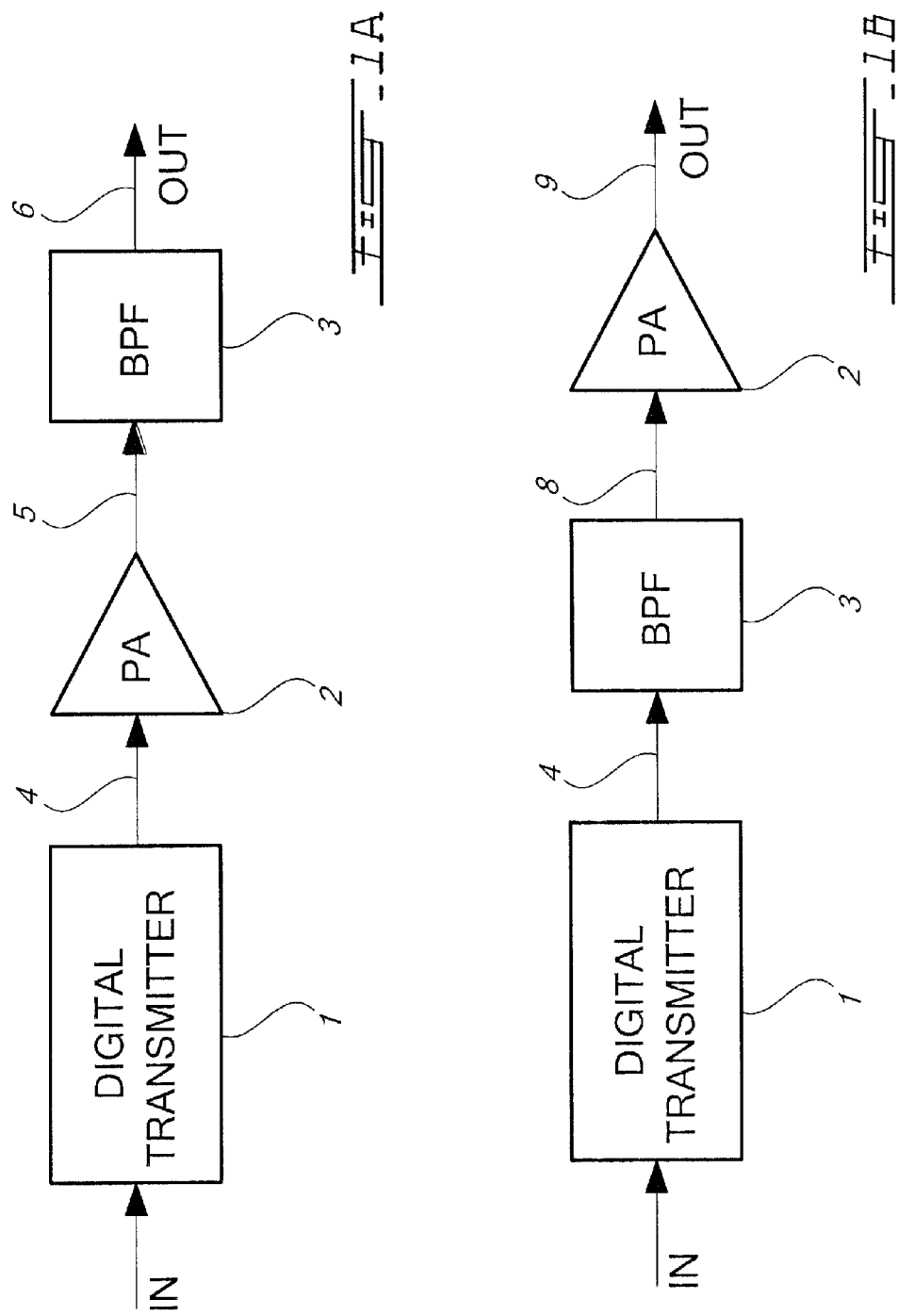

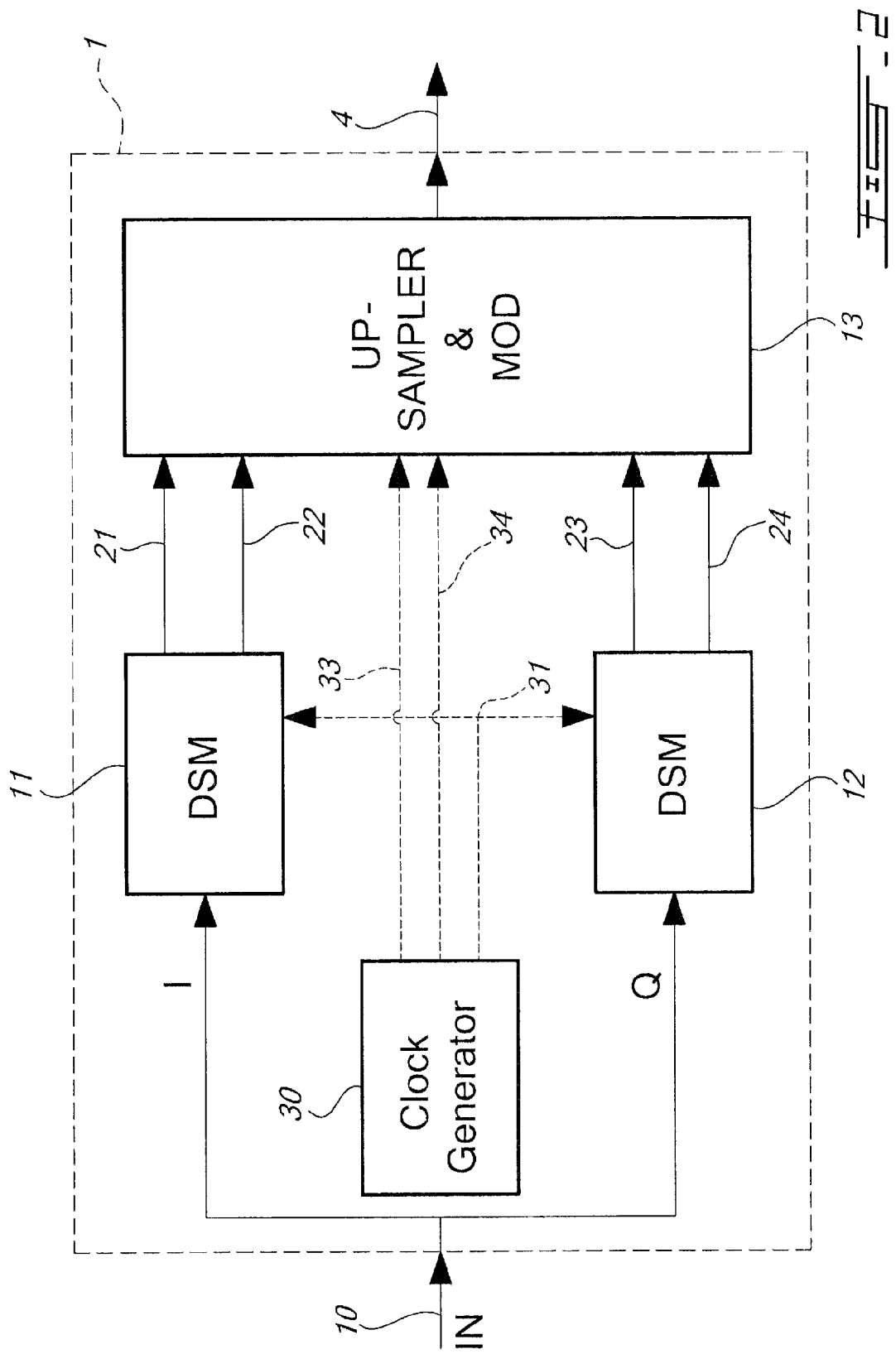

US 8,724,733 B2

ALL-DIGITAL MULTI-STANDARD TRANSMITTERS ARCHITECTURE USING DELTA-SIGMA MODULATORS

FIELD

The present invention generally relates to transmitter architectures. More specifically, the present invention is concerned with a digital transmitter architecture using low-frequency Delta-Sigma Modulators (DSMs) cascaded with binary up-sampler and modulator block working at higher frequency.

BACKGROUND

The new generation of communication standards uses complex modulation techniques in order to gain more spectrum efficiency. These modulation types generate signals with high varying envelopes that generally impose stringent constraints on the linearity versus power efficiency trade-off of power amplifiers. Traditional transmitter architectures include linear power amplifiers (class A or class AB) operated in back-off, which results in poor efficiency performances.

On the other hand, the proliferation and diversity of communication standards motivates the research to design a multi-standard transceiver that can be used for different communication standards. One expensive approach consists in dedicating one transmitter for each standard and switch between them depending of the input signal type or standard.

The digital transceiver, generally consisting in implementing a great portion of a transceiver in the digital domain, is another solution. Indeed, the digital transceiver is easily configured to be compliant with different standards. One approach in the design of such a digital transmitter is the use of Delta-sigma modulation (DSM) technique. This technique is used to transform the envelope and phase modulated baseband signal in one digital bit stream representing the signal. This technique also shapes the quantization noise outside of the useful bandwidth.

BRIEF DESCRIPTION OF THE DRAWINGS

In the appended drawings:

FIG. 1A is a general block diagram of a first digital transmitter based on delta-sigma modulation (DSM);

FIG. 1B is a general block diagram of a second digital transmitter based on delta-sigma modulation (DSM);

FIG. 2 is a block diagram illustrating the architecture of a delta-sigma transmitter based on two DSMs according to a first illustrative embodiment of the present invention;

DETAILED DESCRIPTION

Figure 3B:
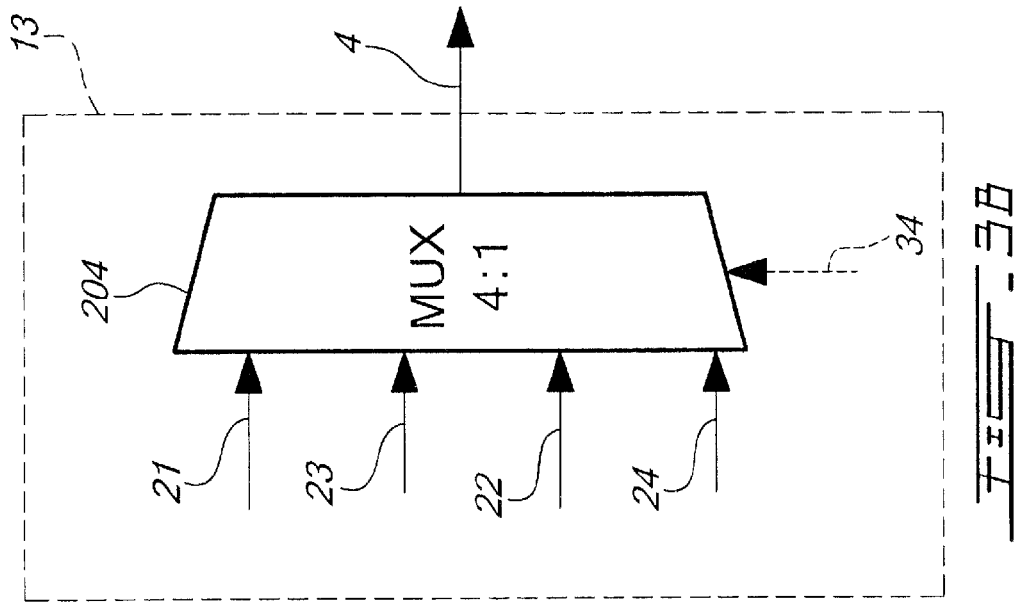
FIG. 3B is a block diagram of a second illustrative embodiment of the up-sampler and modulator block for the delta-sigma transmitter illustrated in FIG. 2.

In accordance with an illustrative embodiment of the present invention, there is provided a digital transmitter producing a binary stream output signal at a desired RF carrier frequency from an envelope or an envelope and phase varying input signal, the digital transmitter comprising:

at least one delta-sigma modulator so configured as to receive and convert the input signal into a complementary binary stream pair;

an up-sampler and modulator so configured as to receive and transform the complementary binary stream signal pair into the binary stream output signal at the desired RF carrier frequency;

wherein the delta-sigma modulator operates at a clock frequency independent from the RF carrier frequency.

In accordance with another aspect of the present invention, there is provided a digital transmitter assembly producing an amplified binary stream output signal from an envelope or an envelope and phase modulated input signal, the digital transmitter assembly comprising:

a digital transmitter including:
   at least one delta-sigma modulator so configured as to receive and convert the input signal to a complementary binary stream pair;
   an up-sampler and modulator so configured as to receive and transform the complementary binary stream signal pair to the desired RF carrier frequency;
a band pass filter receiving the binary stream signal from the digital transmitter; the band pass filter being so configured as to reject the quantization noise present in the binary stream signal; and
a power amplifier so connected to the band pass filter as to receive the filtered binary stream signal from the band pass filter; the power amplifier being so configured as to linearly amplify the filtered binary stream signal to yield the amplified binary stream output signal.

According to another aspect of the present invention, there is provided a digital transmitter assembly producing an amplified binary stream output signal from an envelope or an envelope and phase modulated input signal, the digital transmitter assembly comprising:

a digital transmitter including:
   at least one delta-sigma modulator so configured as to receive and convert the input signal to a complementary binary stream pair;
   an up-sampler and modulator so configured as to receive and transform the complementary binary stream signal pair to the desired RF carrier frequency;
a power amplifier receiving the binary stream signal from the digital transmitter; the power amplifier being so configured as to linearly amplify the binary stream signal; and
a band pass filter so connected to the power amplifier as to receive the amplified binary stream signal from the power amplifier; the band pass filter being so configured as to reject the quantization noise present in the amplified binary stream signal to yield an amplified binary stream output signal. The present description refers to other documents listed at the end of the present disclosure. These documents are hereby incorporated by reference in their entirety.

The use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

Other objects, advantages and features of the present invention will become more apparent upon reading of the following non-restrictive description of illustrative embodiments thereof, given by way of example only with reference to the accompanying drawings.

The present invention uses Delta-Sigma modulators (DSMs). As is generally known to those skilled in the art, these modulators generate a binary flow stream representing the baseband or the low-IF signal to be transmitted. Generally stated, the present invention proposes the implementation of an up-sampler and modulator block that follows the DSMs to generate the RF equivalent of the baseband signal to be transmitted. The RF signal is also a higher frequency bit stream signal. As will be apparent from the following disclosure, the up-sampler and modulator block is simple to implement and contains only one or a few multiplexers implemented in high speed logic technology. Only the multiplexer works at the RF frequency.

Consequently, the proposed technology reduces the constraints on the speed of the DSMs allowing a possible increase in their order and consequently an improvement in the signal quality.

Generally stated, the present invention concerns the implementation of a digital transmitter for wireless or wired communication networks such as, for example, terrestrial wireless communication, satellite communication, data networks and audio and video wireless and wired broadcasting. The digital transmitter has many advantages compared to the traditional analog transmitter. As non-limiting examples, the digital transmitter results in better signal quality, it is easy to be configured to comply with different standards without duplicating the hardware, it may also increase the transmitter over all power efficiency by reducing the energy consumption of the power amplifier and the analog components.

FIGS. 1A and 1B each show a general block diagram of a digital transmitter. In the first scenario of FIG. 1A, the band-pass filter (BPF) 3 is applied at the output of the power amplifier (PA) 2. In the second scenario of FIG. 1B, the BPF 3 it is applied to the signal before its amplification by the PA 2.

In both cases, the input signal to the digital transmitter 1 is an envelope or an envelope and phase modulated signal. The input signal can be analog or digital, real or complex envelope, and baseband or modulated around an IF frequency. The digital transmitter 1 transforms the envelope varying signal into a high speed binary stream signal 4 representing the signal up-converted to the RF frequencies. Due to the signal transformation from envelope varying to binary stream, quantization noise is present in the signal spectrum adjacent to signal band. In addition, signal 4 contains harmonics with power level less than the signal power level around the fundamental.

In the first scenario of FIG. 1A, the power amplifier 2 receives the binary stream signal 4 as an input. In this case, an efficient PA such as, for example, a switching mode PA or a highly nonlinear PA can be used without altering the signal quality. The amplified signal 5 at the output of the PA 2 is also a binary stream having the same sequence as the binary stream signal 4 but having a higher power. The band-pass filter 3 selects the signal around the fundamental or one of the harmonics and rejects the quantization noise present in the amplified signal 5. The resulting output signal 6 is an envelope varying signal, which represents a linearly amplified version of the input signal.

In the second scenario of FIG. 1B, the binary stream 4 is filtered before amplification. Like the input signal, the filtered binary stream signal 8 is envelope varying. The digital transmitter 1 and BPF 3 operate as a traditional transmitter but with high signal quality generation. The PA 2 amplifies the filtered binary stream signal 8. In this case, the PA 2 could be any linear power amplifier structure. This may include, but is not necessary limited to, class A, class AB, Push-pull, LINC and Doherty with or without a linearization technique such as digital and analog pre-distortion, feedback, feed forward, envelope tracking, envelope elimination and restoration, etc.

Turning now to FIG. 2, the details of the architecture of the digital transmitter 1 according to a first illustrative embodiment will be described.

FIG. 2 schematically illustrates, in block diagram form, a digital transmitter 1 to be used when the input signal is a complex envelope composed of separate I and Q signal components.

The digital transmitter 1 includes an input 10, first and second DSMs 11 and 12, an up-sampler and modulator 13 and a clock generator 30.

It is to be noted that the clock generator 30 could be separate from the other elements of the digital transmitter 1.

Each of the I and Q signal components may be baseband or translated around an IF frequency. They may be analog or digital. The first and second DSMs 11 and 12 transform the envelope varying signals I and Q into complementary binary stream pairs 21, 22 and 23, 24. DSMs 11 and 12 operate at low clock frequencies compared to the RF carrier frequency. The frequency of operation of the DSMs 11 and 12 is independent from the carrier frequency and depends only on the signal bandwidth and specification. The architecture of DSMs 11 and 12 can be the same for all types of signals and will be discussed hereinbelow with reference to FIG. 6.

The complementary binary stream pair 21, 22 is the complementary binary stream pair corresponding to I component of the input signal and the complementary binary stream pair 23, 24 is the complementary binary stream pair corresponding to Q component of the input signal. The up-sampler and modulator block 13 processes these two pairs of signals to provide the RF pulse-shaped binary stream signal 4 as the output of the digital transmitter 1. The up-sampler and modulator 13 operates at higher frequency than the DSMs 11 and 12. Indeed, contrary to the DSMs 11 and 12, the frequency of operation of the up-sampler and modulator 13 depends mainly on the carrier frequency of the signal. The frequency of operation of the up-sampler and modulator 13 is related to the carrier frequency according to the following formulae:

$$f_{33} = 2\left(\frac{f_c}{N} - f_b\right)$$

and $$f_{34} = 4\left(\frac{f_c}{N} - f_b\right)$$

where $f_{33}$ is the frequency of clock 33; $f_{34}$ is the frequency of clock 34; $f_c$ is the desired RF carrier frequency; $f_b$ is the IF carrier frequency of the signals I and Q at the input of the DSMs 11 and 12 ($f_b$=0 if I and Q are baseband signals; and N is the number of the harmonic of the signal 4 considered as useful signal.

Figure 3A:
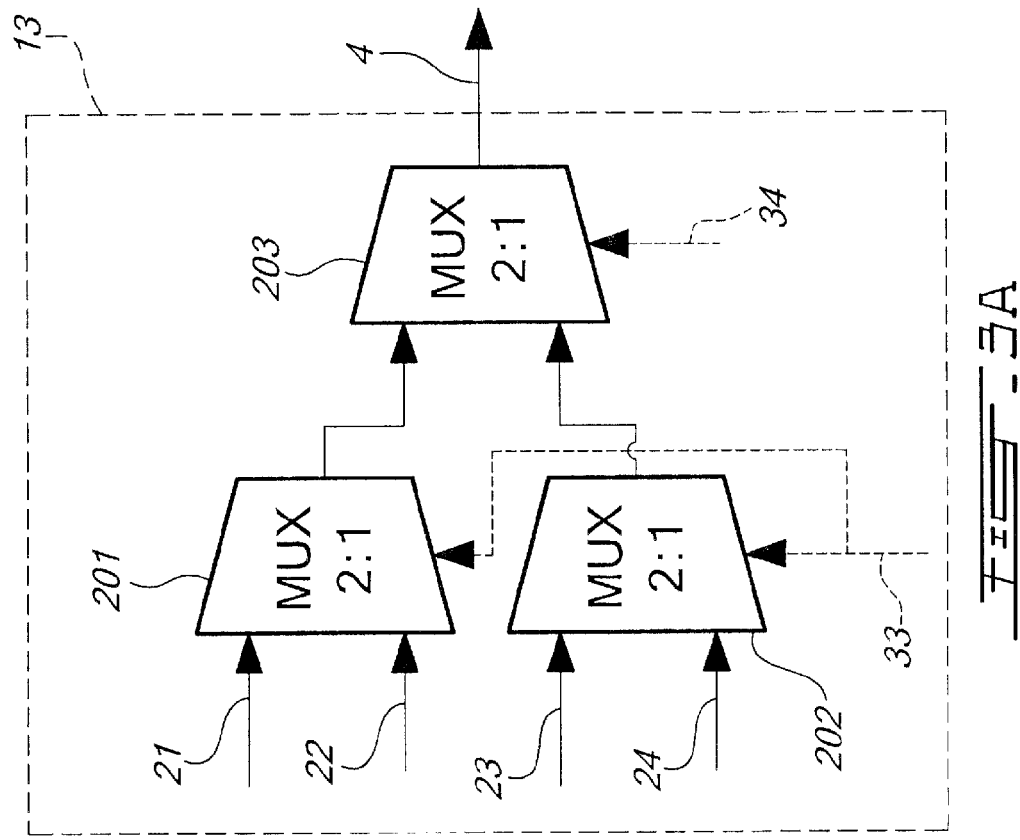
FIG. 3A is a block diagram of a first illustrative embodiment of the up-sampler and modulator block for the delta-sigma transmitter illustrated in FIG. 2.

FIGS. 3A and 3B show two illustrative embodiments of the up-sampler and modulator block 13 of the transmitter 1 of FIG. 2. The up-sampler and modulator block 13 can be implemented using one (FIG. 3B) or many (FIG. 3A) multiplexers. These multiplexers alternate at their frequency of operation in the given order the signals 21, 23, 22, and 24. This operation modulates the I and Q signals around a carrier defined by the clock frequency of the multiplexers.

FIG. 3A illustrates the case of three 2:1 multiplexers 201, 202 and 203, where the clock 33 frequency is the multiplexing frequency for the multiplexers 201 and 202 and has a frequency equal to about double the difference between the desired carrier frequency of the output signal and the input signal carrier frequency as defined hereinabove. The clock 34 frequency is the multiplexing frequency for the multiplexer 203 and has a frequency equal to about double the frequency of the clock 33 as defined hereinabove.

FIG. 3B illustrates the case of one 4:1 multiplexer 204 where the clock 34 frequency is the multiplexing frequency and has a value equal to about four times the difference between the desired carrier frequency of the output signal and the input signal carrier frequency as defined hereinabove.

In both embodiments of the up-sampler and modulator block 13 of FIGS. 3A and 3B, the main function is the same and consists in up-sampling all the signals at a high frequency. This up-sampling frequency is adjusted according to the carrier frequency of the signal. After up-sampling, signal pairs 21, 22 and 23, 24 are modulated around a carrier frequency. A choice of an up-sampling speed equal to about double the difference between the desired carrier frequency of the output signal and the input signal carrier frequency (in the case of the first embodiment suggestion in FIG. 3A) and about four time the carrier frequency (in the case of the second embodiment suggestion in FIG. 3B) allows the quadrature modulation of the I and Q transformed component signals (the complementary pairs 21, 22 and 23, 24) to maintain a binary stream result for the modulated binary stream signal 4. This is due to the fact that the multiplication of a symbol I with a cosine wave function sampled at about four times the carrier frequency results in a repetition of the following sequence I 0 $\bar{I}$ 0. And the multiplication of a symbol Q with a sine wave function sampled at about four times the carrier frequency results in a repetition of the following sequence 0 Q 0 $\bar{Q}$. Consequently, the sum of both sequences is equal to I Q $\bar{I}$ $\bar{Q}$, which can be implemented as suggested in FIGS. 3A and 3B.

The illustrative embodiments of FIGS. 3A and 3B generally avoid any phase shift of the local oscillator signal, usually used in traditional architectures. Consequently, in addition to lowering the quantization noise floor compared to a traditional architecture, the proposed technology has the potential to reduce the gain and phase imbalance in the transmitter resulting in better signal quality.

Figure 4:
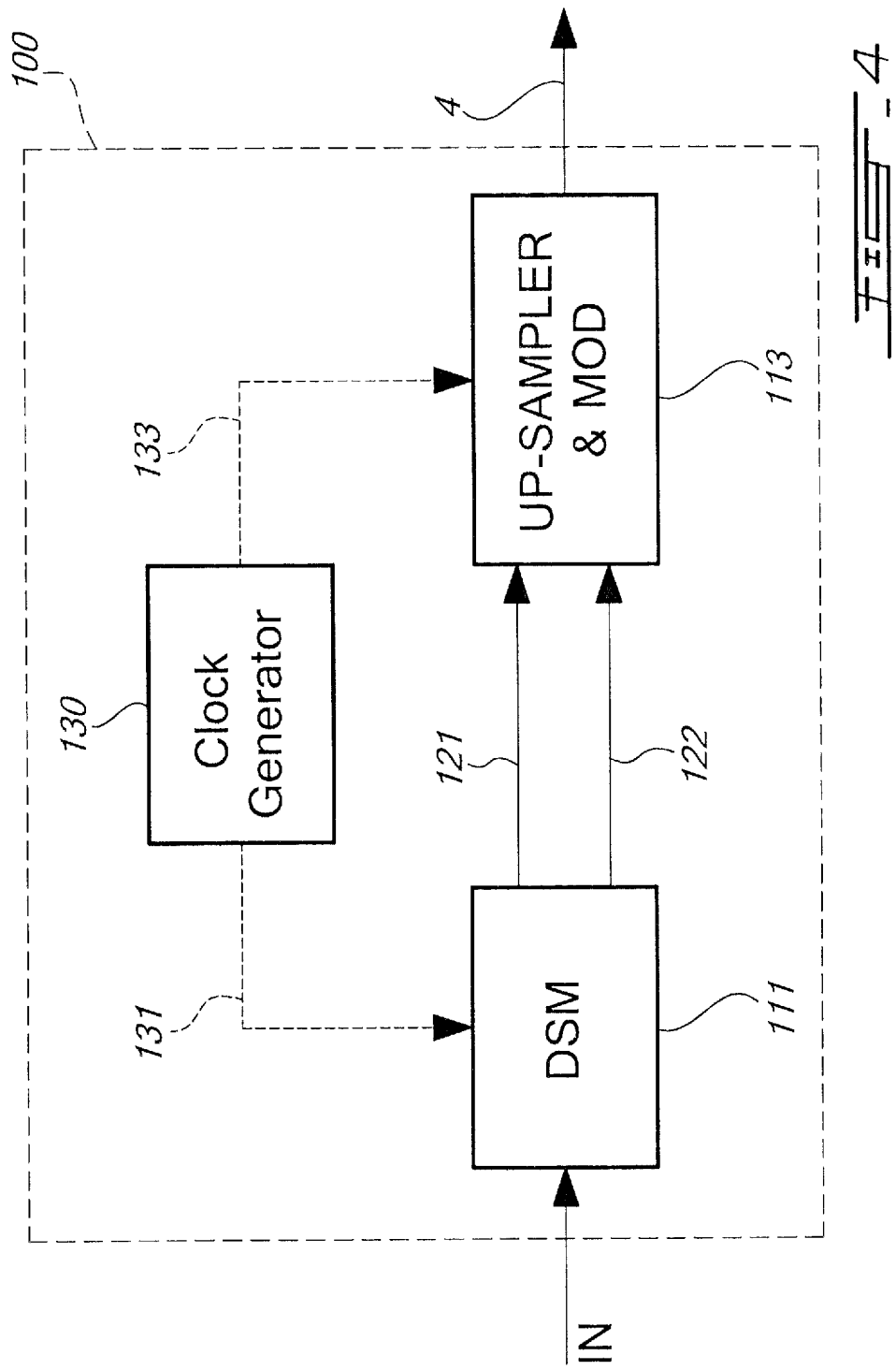
FIG. 4 is a block diagram illustrating the architecture of a delta-sigma transmitter based on one DSM according to a second illustrative embodiment of the present invention.

Turning now to FIG. 4 of the appended drawings, the details of the architecture of a digital transmitter 100 according to a second illustrative embodiment will be described.

FIG. 4 generally corresponds to the case of one branch signal such as a real envelope signal in baseband or modulated around RF frequency or a complex envelope signal modulated around an IF frequency. In this case, only one DSM 111 converts the input envelope varying signal to a complementary binary stream pair 121, 122. Then the up-sampler and modulator block 113 transforms this complementary binary stream signal pair to the desired RF frequency. In this configuration, the DSM 111 runs at a slow clock frequency independent from the carrier frequency. Only the up-sampler and modulator block 113 runs at about twice the carrier frequency.

Figure 5:
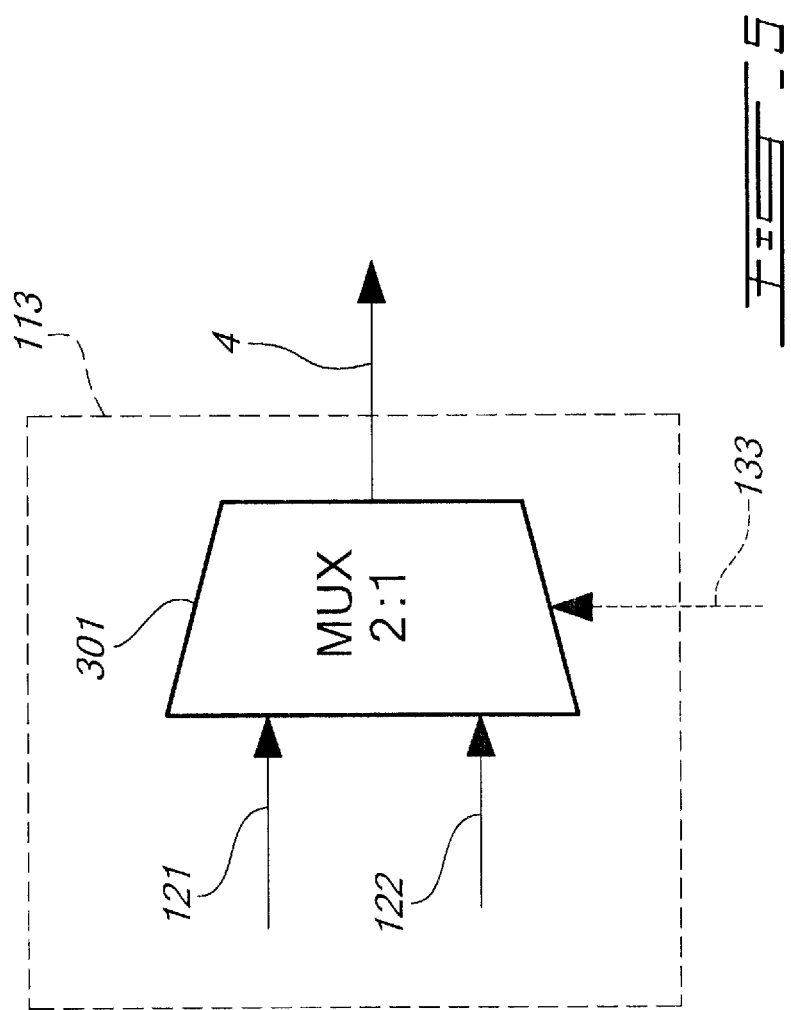
FIG. 5 is a block diagram of an illustrative embodiment of the up-sampler and modulator block for the delta-sigma transmitter illustrated in FIG. 4.

FIG. 5 shows an illustrative embodiment of the up-sampler and modulator block 113 illustrated in FIG. 4. As can be seen from this figure, the signals at the input of the modulator block 113 are the output complementary binary stream pair 121, 122 from the DSM 111. The up-sampler and modulator 113, in this case, is a 2:1 multiplexer 301. The multiplexing frequency of 301 is the frequency of clock 133, which is related to the desired RF carrier frequency as follows:

$$f_{133} = 2\left(\frac{f_c}{N} - f_{b'}\right)$$

where $f_{133}$ is the frequency of clock 133; $f_c$ is the desired RF carrier frequency; $f_{b'}$ is the IF carrier frequency of the input signal of the DSM 111 ($f_{b'}$=0 if this signal is a baseband signal); and N is the number of the harmonic of the signal 4 considered as useful signal.

In the illustrative embodiment of FIG. 5, the main function of the block 113 is generally to up-sample the signal at higher frequency. This up-sampling frequency is adjusted according to the desired carrier frequency and the input signal carrier frequency (IF frequency for IF signals and zero for baseband signals). After up-sampling, the signal is modulated around a carrier frequency. The choice of an up-sampling frequency around twice the carrier frequency generates a binary stream at the output of block 113 representing the signal around the carrier frequency. This is true since a multiplication of the signal S with sine wave sampled at twice the carrier frequency corresponds to the alternation of the sequence S $\bar{S}$, which corresponds to the alternation between both branches of the complementary pair of the signal at the mentioned frequency. The illustrative embodiment of FIG. 5 can be configured easily compared to traditional transmitters' embodiments. Besides, the illustrative embodiment of FIG. 5 introduces less leakage that is usually present in traditional transmitters.

Figure 6:
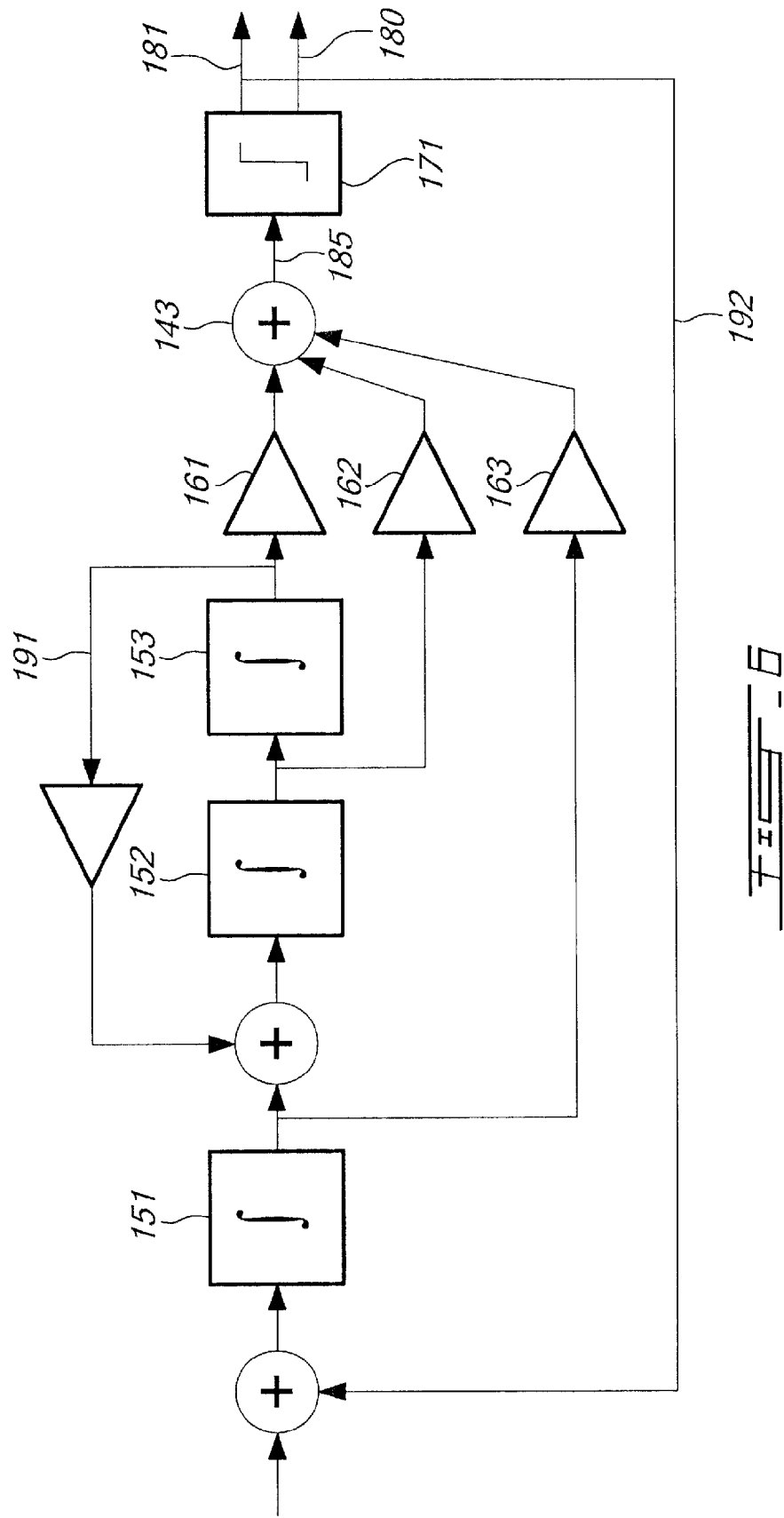
FIG. 6 is a block diagram illustrating an example of a low pass third order delta-sigma modulator that can be used in the embodiments illustrated in FIGS. 2 and 4.

FIG. 6 shows a typical block diagram of a third order delta-sigma modulator that may be used in the illustrative embodiments shown in FIGS. 2 and 4. The structure contains three integrators 151, 152 and 153 with feedback loops 191 and 192. The outputs from each integrator are scaled using gain blocks 161, 162 and 163 and then summed by summator 143 to generate the output 185. This output 185 is then quantized into one complementary binary stream pair output by the level detector 171. The output signal 180, 181 of the delta-sigma modulator is then a complementary binary stream pair having the quantization noise shaped outside the useful bandwidth. The delta-sigma modulation theory is well know to those of ordinary skill in the art and, therefore, will not be further described in the present specification.

It will be apparent to one skilled in the art that other types of delta-sigma modulators, such as, for example band pass or a different topology of low pass, can be used in the illustrative embodiments presented in FIGS. 2 and 4, instead of the DSM illustrated in FIG. 6.

Figure 7A:
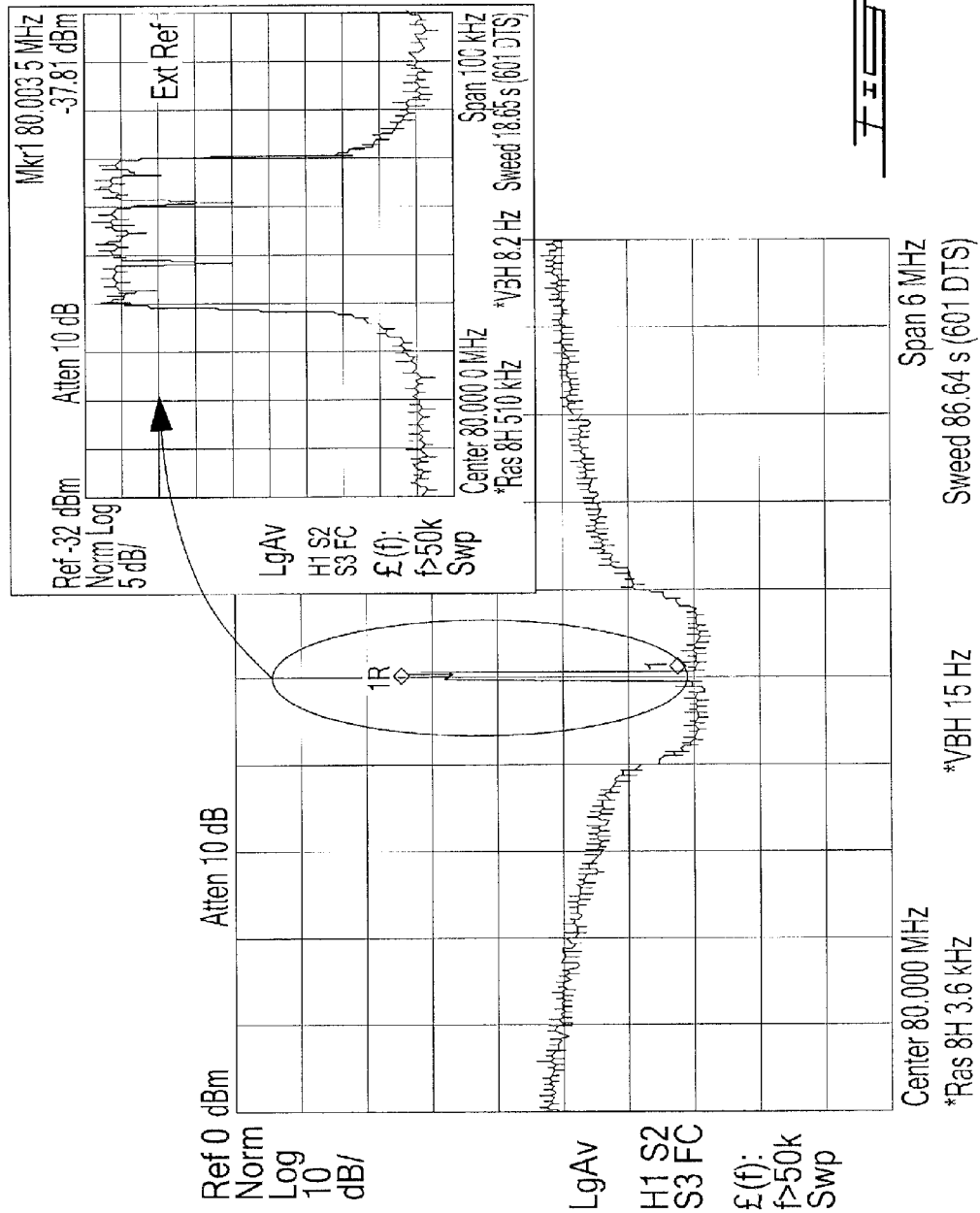
FIGS. 7A to 7C show some typical measurement results testing the performance of the illustrated embodiments of the present invention.
Figure 7B:
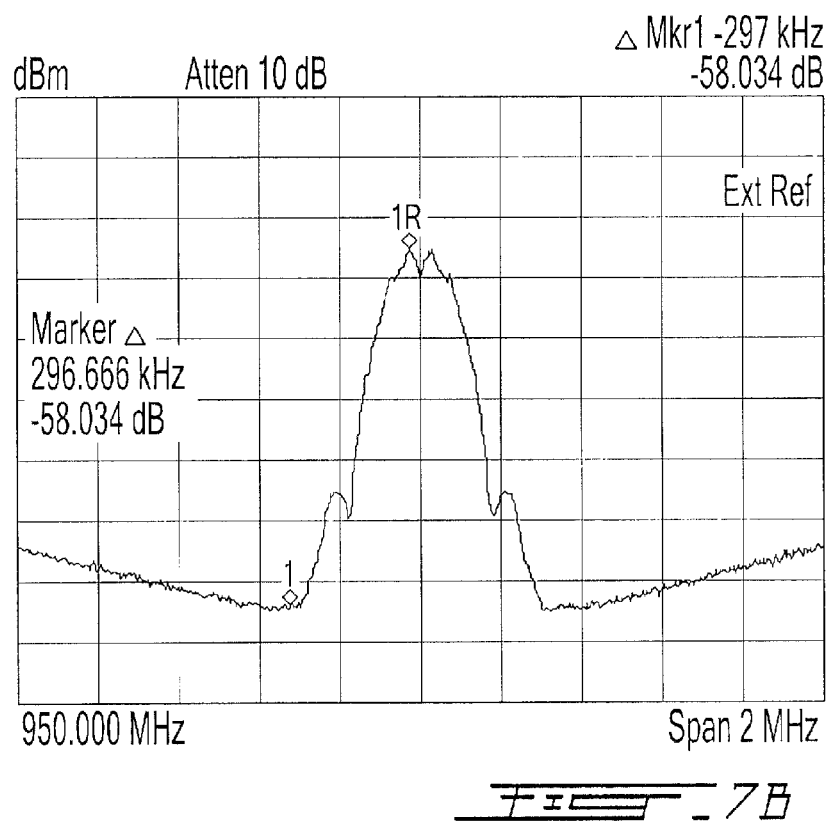
Figure 7C:
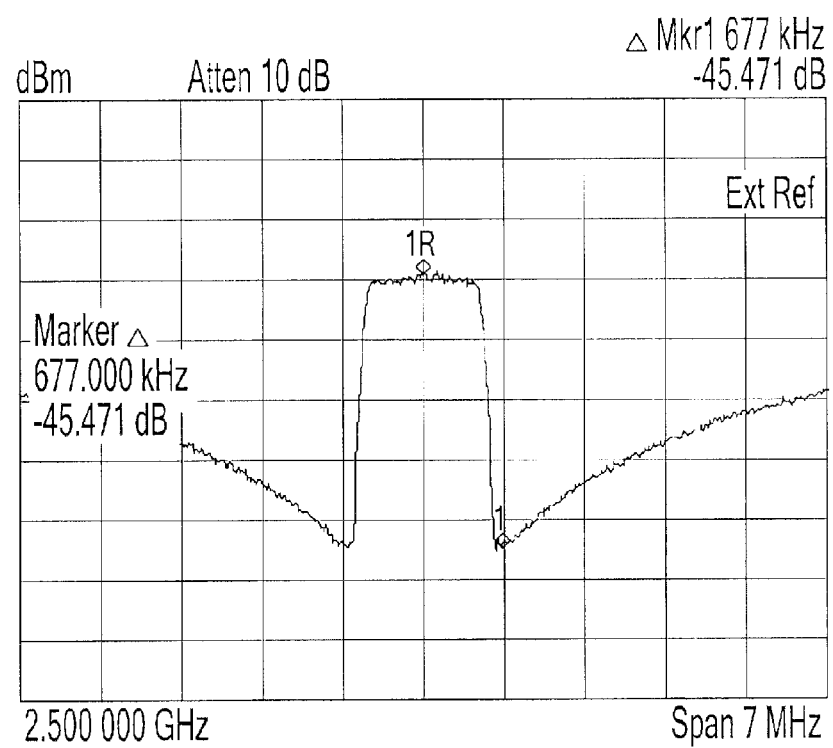

FIGS. 7A to 7C presents some typical measurement results of the proposed illustrative digital transmitter embodiments. The standards used in this illustration are not restrictive. The technology can be applied to any kind of signal and any type of application that comprises but not necessarily limited to wireless data networking standards (such as WLAN, WiMAN), wireless data communication standards (such as UMTS, GSM, EDGE), satellite applications (such as GPS, Satellite radio, DVB, satellite communication applications) and Custom signal waveforms for specific purpose applications (such as military applications). The signal modulation can be BPSK, QPSK, QAM, PSK, FSK, GMSK. These signals can be combined with any channel division multiplex techniques and/or any multiple access technique such as FDMA, TDMA, CDMA, OFDM, WCDMA.

FIG. 7A presents an example of the signal at the output of the DSM 111 (the pair 121, 122) of FIG. 4. The signal has a bandwidth of 30 KHz and is centered around 80 MHz IF frequency. The DSM used in this test is a fifth order delta-sigma modulator (not shown).

FIGS. 7B and 7C show the results of binary stream signal 4 for an EDGE signal and a WiMAX signals respectively. EDGE and WiMAX are two standards that can be used with the proposed technology. The proposed technology can be used with any standard for wireless and satellite communication application. It can be used for wired transmission standards us well. There is no limitations that prevent the present technology to be used with a well established standard or signal types for specific purposes such as signals used in military applications. The following is a list of different standards and applications where the technology can be applied. However, this list is not restrictive:

Wireless data network standards: IEEE802.11a, IEEE802.11b, IEEE802.11g, HiperLAN I, HiperLAN II, WiMAX;

Wireless Communication standards: UMTS, GSM, GPRS, EDGE;

Satellite Communications;

Satellite broadcasting applications: GPS, satellite radio, DVB; and

Custom signal waveforms for specific purpose applications such as military applications. The signal modulation can be BPSK, QPSK, QAM, PSK, FSK, GMSK. These signals can be combined with any channel division multiplex techniques and/or any multiple access technique such as FDMA, TDMA, CDMA, OFDM, WCDMA.

The EDGE signal of FIG. 7B has a bandwidth of about 200 kHz and is centered on an RF frequency equal to about 950 MHz. The WiMAX signal of FIG. 7C has a bandwidth equal to 1.25 MHz and is centered on an RF frequency equal to 2.5 GHz. Both results are obtained using the same hardware as shown in FIG. 8.

Figure 8:
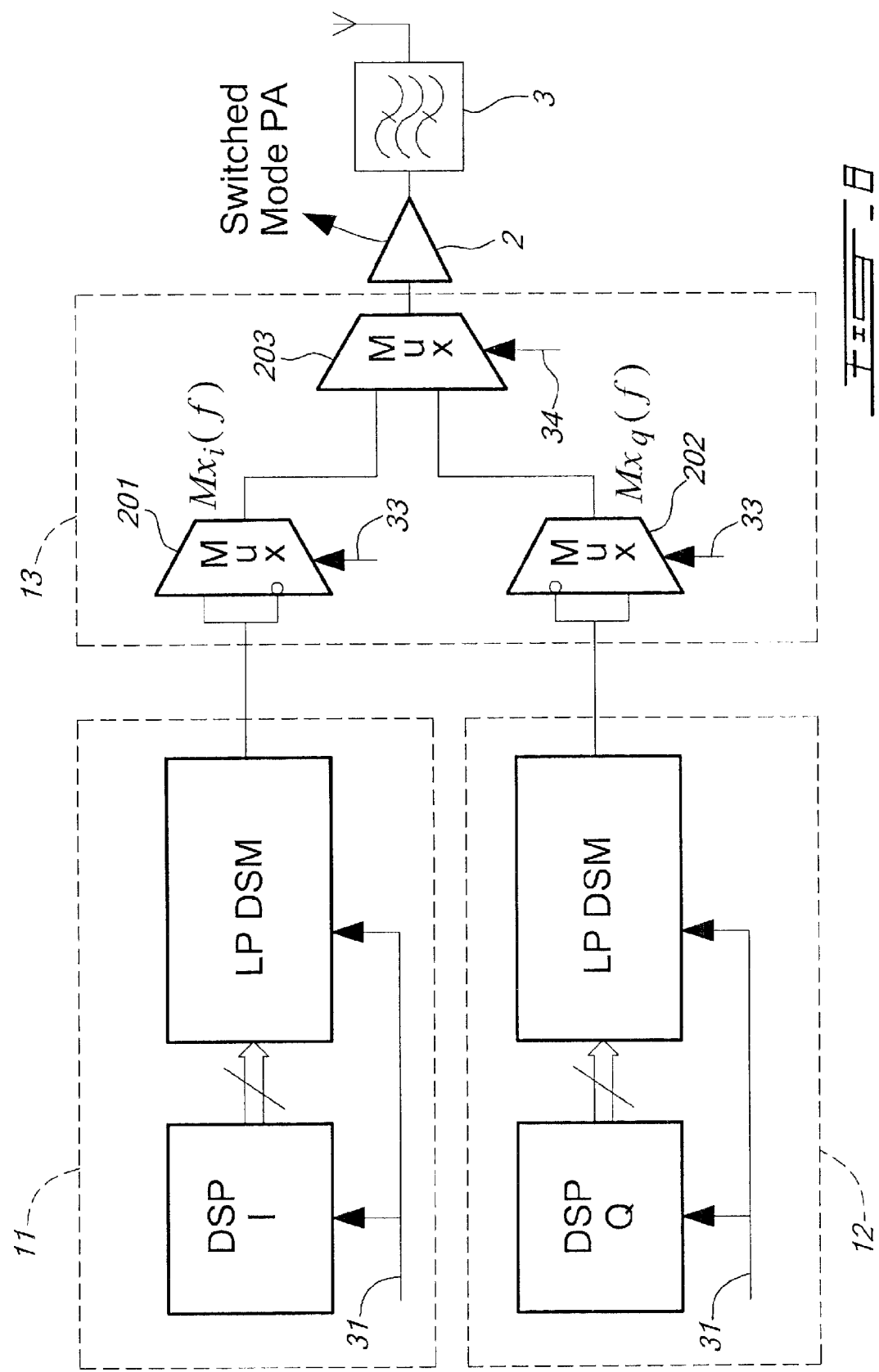
FIG. 8 is a block diagram illustrating a hardware design allowing obtaining an EDGE signal having a bandwidth of about 200 kHz and centered on an RF frequency equal to 950 MHz, and a WiMAX signal having a bandwidth equal to 1.25 MHz and centered on an RF frequency equal to 2.5 GHz.

FIG. 8 is an example of implementation of the architecture in FIG. 2 combined with FIG. 3A. The third order DS modulators 11 and 12 is implemented in the FPGA EP1S80 evaluation board from Altera Inc. The NB7L86M evaluation board from On semiconductor Inc. is used to implement the multiplexers 201, 202, and 203. The switching mode class F PA is designed from the RT233 transistor from RFHIC Inc. The only change to the transmitter of FIG. 8 for the Edge and the WiMAX signals is the frequency of the clock signals 31, 33, 34. The frequencies of the clocks 33 and 34 are defined hereinabove, and the frequency of the clock 31 is not related to the carrier frequency. It will be understood that the frequency of this clock 31 determines the quality of the signal: the higher is the frequency, the better is the signal quality.

In the illustrative case of the measurement results given in FIG. 7, the clock signals of the hardware set-up of FIG. 8 are set as follows: for the EDGE signal, the clocks 31, 33 and 34 are set to 160 MHz, 1900 MHz and 3800 MHz, respectively, while for the WiMAX signal, the clocks 31, 33 and 34 are set to 200 MHz, 5000 MHz and 10000 MHz respectively. The DSM order and type may also change to give better trade-off between signal quality and hardware complexity.

The illustrative embodiments described hereinabove are easily configured for a given standard and are suitable for multi-standard applications since they offers a low cost, low complexity and better performance solution. The modulation and signal types, the bandwidth and the carrier frequency presented in these measurements are only examples to give an idea about the performances of the technology. Of course, the capability of the illustrative embodiments is not limited to such signal and modulation types and bandwidths.

It will be apparent to one skilled in the art that the illustrative embodiments of the digital transmitters described hereinabove may be arranged and constructed in discrete, semi-discrete, surface mount, multi-chip, or monolithic technology for utilization in one of the mobile station and base station for wireless communication and in one user terminal and server application for wired or wireless networks.

The illustrative embodiments described herein also make possible the generation of signals around RF frequency in the range of few Giga Hertz (GHz). As mentioned hereinabove, changing the frequency is easy to achieve by only changing the clock frequency and generally does not require a considerable change in the transmitter architecture.

As is easily understood by one skilled in the art, the proposed illustrative embodiments are easy to implement and may require only one signal clock. When this is the case, there is no need to synchronize two different clock signals and/or to adjust the gain and phase of the signal at different stages of the implemented structure. This reduces the cost of the implementation in terms of resources and energy consumption and ensures good signal quality. Consequently, the risks of algorithm divergence or bad adjustment performances are minimized.

For example, the digital transmitter 1 of FIG. 2 uses either:

one clock signal if the topology of FIG. 3B is used: the clock frequency 34 is generally equal or close to four times the carrier frequency;

two (2) clock signals if the topology of FIG. 3A is used: the first clock frequency 33 is generally equal or close to twice the carrier frequency and the second clock frequency 34 is generally equal or close to four times the carrier frequency.

The digital transmitter 100 of FIG. 4 uses one clock signal 133 equal or close to twice the carrier frequency.

It is to be understood that the invention is not limited in its application to the details of construction and parts illustrated in the accompanying drawings and described hereinabove. The invention is capable of other embodiments and of being practiced in various ways. It is also to be understood that the phraseology or terminology used herein is for the purpose of description and not limitation. Hence, although the present invention has been described hereinabove by way of illustrative embodiments thereof, it can be modified, without departing from the spirit, scope and nature of the subject invention as defined in the appended claims.

REFERENCES

R. Schreier, J. Lloyd, L. Singer, D. Paterson, M. Timko, M. Hensley, G. Patterson, K. Behel, J. Zhou, "A 10-300-MHz IF-digitizing IC with 90-105-dB dynamic range and 15-333-kHz bandwidth," IEEE Journal of Solid-State Circuits, Vol. 37, Iss. 12, pp. 1636-1644, December 2002

Y. Fujimoto, P. L. Re, M. Miyamoto, "A delta-sigma modulator for a 1-bit digital switching amplifier," IEEE Journal Solid-State Circuits, pp. 1865-1871, September 2005

J. F. Jensen, G. Raghavan, A. E. Cosand, and R. H. Walden, "A 3.2-GHz second-order delta-sigma modulator implemented in InP HBT technology," IEEE Journal Solid-State Circuits, pp. 1119-1127, October 1995

J. Ketola, J. Sommarek, J. Vankka, K. Halonen, "Transmitter utilising bandpass delta-sigma modulator and switching mode power amplifier," Proc. Intl. Sym. Circuits and Systems (ISCAS), pp. 633-6, May 2004

M. B. Sandler, Digital-to-analogue conversion using pulse width modulation, IEE Electronics and Communication Engineering Journal, pp. 339-348, December 1993

R. E. Hiorns and M. B. Sandler, Power to analogue conversion using pulse width modulation and digital signal processing, IEEE proceedings-G, vol. 140, No. 5, pp. 329-338, October 1993

A. Magrath, I. Clarke, M. sandler, Design and Implementation of a FPGA Sigma-Delta Power DAC, Signal Processing Systems: Design and Implementations, IEEE press, 0-7803-3806-5, pp. 511-521, 1997

A. Jerng, C. G. Sodini, "A Wideband ΔΣ Digital-RF Modulator for High Data Rate Transmitters," IEEE Journal of Solid-State Circuits, Vol. 42, Iss. 8, pp. 1710-1722, August 2007

R. Schreier, G. C. Temes, "Understanding Delta-Sigma Data Converters," Wiley-IEEE Press, edition 1, October 2004

What is claimed is:

1. A digital transmitter producing a binary stream output signal at a desired RF carrier frequency from an amplitude or amplitude and phase varying baseband modulated or IF modulated input signal, the digital transmitter comprising:
   at least one delta-sigma modulator operating at a first clock frequency independent from the desired RF carrier frequency and so configured as to receive and convert the amplitude or amplitude and phase varying baseband modulated or IF modulated input signal into a complementary binary stream pair having a first data rate equal to the first clock frequency and having a carrier frequency equal to zero or to an intermediate frequency;
   an up-sampler and modulator so configured as to receive and multiplex, at a second clock frequency independent from the first clock frequency, the complementary binary stream pair to transform the complementary binary stream pair into the binary stream output signal having a second data rate greater than the first data rate, greater than the desired RF carrier frequency, and calculated as a function of the desired RF carrier frequency;
   wherein the digital transmitter is an all-digital transmitter that maintains all signals in binary stream format between the at least one delta-sigma modulator and an output of the up-sampler and modulator.

2. The digital transmitter recited in claim 1, wherein the at least one delta-sigma modulator includes one delta-sigma modulator.

3. The digital transmitter recited in claim 2, further comprising a clock generator so configured as to generate a clock signal to be supplied to the up-sampler and modulator.

4. The digital transmitter recited in claim 3, wherein the frequency of the clock signal supplied to the up-sampler and modulator is about at least twice the desired RF carrier frequency.

5. The digital transmitter recited in claim 3, wherein the clock generator so configured as to generate a clock signal to be supplied to the delta-sigma modulator.

6. The digital transmitter recited in claim 2, wherein the up-sampler and modulator includes a multiplexer.

7. The digital transmitter recited in claim 6, wherein the multiplexer is a 2:1 multiplexer that is so configured as to receive the complementary binary stream pair as inputs; the output of the 2:1 multiplexer defining the binary stream output signal.

8. The digital transmitter recited in claim 1, wherein:
   the input signal is a complex envelope composed of separate I and Q signal components; and
   the at least one delta-sigma modulator includes a first and second delta-sigma modulators; the first delta-sigma modulator receiving the I signal component and the second delta-sigma modulator receiving the Q signal component; the first and second delta-sigma modulators respectively generating first and second complementary binary stream pairs.

9. The digital transmitter recited in claim 8, further comprising a clock generator so configured as to generate a clock signal at the second clock frequency to be supplied to the up-sampler and modulator.

10. The digital transmitter recited in claim 9, wherein the clock generator is so configured as to generate a clock signal at the first clock frequency to be supplied to the delta-sigma modulator.

11. The digital transmitter recited in claim 9, wherein the frequency of the clock signal at the second clock frequency supplied to the up-sampler and modulator is about four times the desired RF carrier frequency.

12. The digital transmitter recited in claim 11, wherein the up-sampler and modulator includes a 4:1 multiplexer that is so configured as to receive the first and second complementary binary stream pair as inputs; the output of the 4:1 multiplexer being the binary stream output signal.

13. The digital transmitter recited in claim 11, wherein the clock generator is further configured to generate another clock signal having a frequency about twice the desired RF carrier.

14. The digital transmitter recited in claim 13, wherein the up-sampler and modulator includes:
   a first 2:1 multiplexer that is so configured as to receive a first complementary binary stream pair as inputs; the first 2:1 multiplexer receiving the clock signal having the frequency about twice the desired RF carrier;
   a second 2:1 multiplexer that is so configured as to receive a second complementary binary stream pair as inputs; the second 2:1 multiplexer receiving the clock signal having the frequency about twice the desired RF carrier;
   a third 2:1 multiplexer that is so configured as to receive the outputs of the first and second 2:1 multiplexers as inputs; the third 2:1 multiplexer receiving the clock signal having the frequency about four times the desired RF carrier frequency; the output of the 2:1 multiplexer defining the binary stream output signal.

15. The digital transmitter recited in claim 1, comprising a low pass delta-sigma modulator.

16. A digital transmitter assembly producing an amplified binary stream output signal from an amplitude or amplitude and phase, baseband or IF, modulated input signal, the digital transmitter assembly comprising:

a digital transmitter including:
- at least one delta-sigma modulator operating at a first clock frequency independent from the desired RF carrier frequency and so configured as to receive and convert the amplitude or amplitude and phase, baseband or IF, modulated input signal to a complementary binary stream pair having a first data rate equal to the first clock frequency and having a carrier frequency equal to zero or to an intermediate frequency;
- an up-sampler and modulator so configured as to receive and multiplex, at a second clock frequency independent from the first clock frequency, the complementary binary stream pair to transform the complementary binary stream pair to a binary stream output signal having a second data rate greater than the first data rate, greater than the desired RF carrier frequency, and calculated as a function of the desired RF carrier frequency;

a band pass filter receiving the binary stream output signal from the digital transmitter; the band pass filter being so configured as to reject the quantization noise present in the binary stream output signal; and a power amplifier so connected to the band pass filter as to receive the filtered binary stream output signal from the band pass filter; the power amplifier being so configured as to linearly amplify the filtered binary stream signal to yield the amplified binary stream output signal;

wherein the digital transmitter is an all-digital transmitter that maintains all signals in binary stream format between the at least one delta-sigma modulator and an output of the up-sampler and modulator.

17. The digital transmitter assembly recited in claim 16, comprising a low pass delta-sigma modulator.

18. A digital transmitter assembly producing an amplified filtered binary stream output signal from an amplitude or amplitude and phase, baseband or IF, modulated input signal, the digital transmitter assembly comprising:

a digital transmitter including:
- at least one delta-sigma modulator operating at a first clock frequency independent from the desired RF carrier frequency and so configured as to receive and convert the amplitude or amplitude and phase, baseband or IF, modulated input signal to a complementary binary stream pair having a first data rate equal to the first clock frequency and having a carrier frequency equal to zero or to an intermediate frequency;
- an up-sampler and modulator so configured as to receive and multiplex, at a second clock frequency independent from the first clock frequency, the complementary binary stream pair to transform the complementary binary stream pair to a binary stream output signal having a second data rate greater than the first data rate, greater than the desired RF carrier frequency, and calculated as a function of the desired RF carrier frequency;

a power amplifier receiving the binary stream output signal from the digital transmitter; the power amplifier being so configured as to linearly amplify the binary stream output signal; and a band pass filter so connected to the power amplifier as to receive the amplified binary stream output signal from the power amplifier; the band pass filter being so configured as to reject the quantization noise present in the amplified binary stream signal to yield the amplified filtered binary stream output signal;

wherein the digital transmitter is an all-digital transmitter that maintains all signals in binary stream format between the at least one delta-sigma modulator and an output of the up-sampler and modulator.

19. The digital transmitter assembly recited in claim 18, comprising a low pass delta-sigma modulator.

* * * * *